United States Patent [19]
Abbas

[11] Patent Number: 4,588,896
[45] Date of Patent: May 13, 1986

[54] BISTABLE CIRCUITS HAVING A MONOLITHIC DEVICE FORMED WITH LIGHT EMITTING DIODES AND DETECTORS

[75] Inventor: Daniel C. Abbas, Webster, N.Y.

[73] Assignee: Eastman Kodak Company, Rochester, N.Y.

[21] Appl. No.: 553,325

[22] Filed: Nov. 18, 1983

[51] Int. Cl.⁴ ............................................. H01J 40/14
[52] U.S. Cl. .................................. 250/213 A; 250/551
[58] Field of Search ................... 250/205, 551, 213 A; 455/602; 357/19; 307/311; 364/713

[56] References Cited

U.S. PATENT DOCUMENTS 3,818,451  6/1974  Coleman ........................ 250/213 A
3,842,259  10/1974  Bruning .......................... 250/213 A Primary Examiner—David C. Nelms
Assistant Examiner—James Gatto
Attorney, Agent, or Firm—Raymond L. Owens

[57] ABSTRACT

A bistable circuit having a monolithic device with first and second optically isolated stages is disclosed. Each stage has a light emitting diode and a corresponding detector. Subsurface light from each diode provides optical feedback through the device to its corresponding detector.

3 Claims, 5 Drawing Figures

BISTABLE CIRCUITS HAVING A MONOLITHIC DEVICE FORMED WITH LIGHT EMITTING DIODES AND DETECTORS

CROSS-REFERENCE TO RELATED APPLICATION

Reference is made to my commonly assigned U.S. patent application Ser. No. 553,324 entitled "Monolithic Devices Formed with an Array of Light Emitting Diodes and a Detector" filed Nov. 18, 1983.

FIELD OF THE INVENTION

The present invention relates to bistable circuits which change state and produce optical output signals in response to optical input signals.

DESCRIPTION RELATIVE TO THE PRIOR ART

The term "monolithic device" as used herein refers to a device that is formed on a single semiconductor crystal chip, with the semiconductor chip being formed from for example extrinsic gallium arsenide.

A bistable circuit is often referred to in the art as a flip flop. When at rest, such a circuit is in either of two stable states. A T-type flip flop is one which acts as a toggle and changes state (switches) each time an input signal is received. For example, when a T-type flip flop in one of its two states, is triggered by an input signal, the flip flop switches to its other stable state where it remains until triggered by the next input signal. T-type flip flops are particularly useful for storing binary information.

Most bistable storage circuits include two transistors. In either stable state, one of the transistors is on or conductive while the other is off or non-conductive. The application of an input signal causes the circuit to change state. That is, the transistor that was conductive becomes non-conductive, and the one that was non-conductive becomes conductive. Such circuits suffer from a problem in that they can be inadvertently switched by stray electrical noise. Light emitting diodes and photodetectors (hereinafter referred to as detectors) have been used as elements of bistable storage circuits. See, for example, U.S. Pat. No. 4,300,211 to Hudson issued Nov. 10, 1981 wherein a bistable circuit is disclosed which includes a light emitting diode and a detector as separate discrete circuit elements. Light from the diode passes through the air and illuminates the detector causing it to become conductive. With this arrangement, light emitting diodes and detectors must be accurately aligned and provision must be made to prevent the unwanted illumination of a detector by stray light. See also U.S. Pat. No. 4,284,884 to Dyment et al issued Aug. 18, 1981 which uses a subsurface light from an LED to illuminate an integrated detector to control the LED intensity.

The term "light emitting diode" as used herein refers to a semiconductor device that emits radiation in the optical spectrum (i.e., infrared through ultraviolet) in response to an applied forward bias voltage from an external power source. A light emitting diode has a p-n junction provided by two extrinsic semiconductors. When forward biased by an external power source, such a diode emits optical radiation. Light emitting diodes are attractive sources of optical radiation because they are easy to form, inexpensive to make, highly efficient, and reliable. They are widely used as miniaturized lamps and in display devices such as calculators and watches. They have not been widely used in bistable storage circuits.

SUMMARY OF THE INVENTION

The object of the present invention is to provide a bistable circuit that uses light emitting diodes and is immune to electrical noise and further free from alignment and stray light problems.

In accordance with the present invention, a monolithic device for use in a bistable circuit includes first and second stages. Each stage is optically isolated from the other and includes a light emitting diode (LED) which assumes an active condition in response to a forward bias and produces light which is emitted from the device to provide an output signal and a corresponding output detector which when illuminated by subsurface light from its corresponding activated light emitting diode, produces a photoinduced current.

Signal inverting means (which may or may not be fabricated in the device) electrically couple the detector of each stage to the LED of the other stage so that when a detector is active (illuminated) its coupled LED is inactive. Conversely, when a detector is inactive, its coupled LED is active.

An advantage of the invention is that by fabricating two stages of light emitting diodes-detectors in a monolithic device where subsurface light from an LED is fed back to its corresponding detector, external alignment problems and stray light problems are minimized.

BRIEF DESCRIPTION OF THE DRAWINGS

In the detailed description of the preferred embodiment of the invention presented below, reference is made to the accompanying drawings, in which.

DETAILED DESCRIPTION OF THE PREFERRED EMBODIMENT

Figure 1:
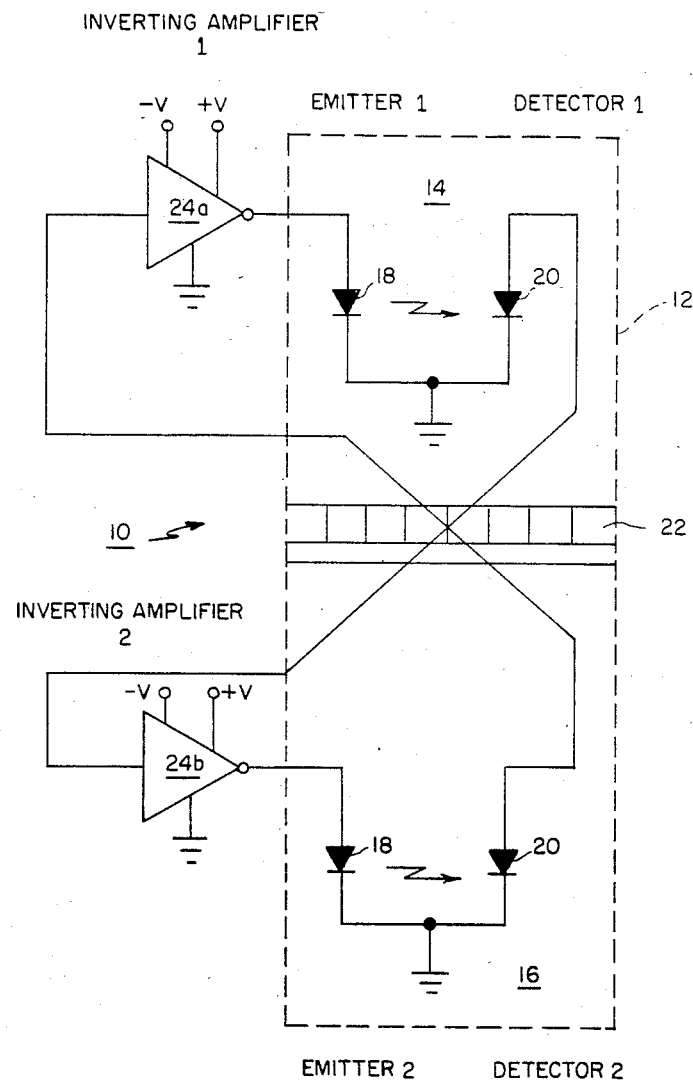
FIG. 1 is a schematic view of a bistable circuit in accordance with the invention.

Referring now to FIG. 1 which shows a schematic of a bistable circuit 10. The circuit includes a monolithic device 12 having two separate stages 14 and 16. Each stage includes a light emitting diode 18 and a detector 20. Subsurface light (shown by an arrow) from each diode 18 illuminates a corresponding detector 20. Optical isolation between the two stages 14 and 16 is provided by a layer of electroplated nickel 22. The monolithic circuit 12 will be described in detail later in this specification. At this point it is sufficient to note the general spatial arrangement of the light emitting diode and detector pairs of stages 14 and 16 which are shown in the schematic plan view of FIG. 2.

The bistable circuit 10 includes two inverting current amplifiers 24a and 24b. The input to amplifier 24a is provided by detector 20 of stage 16 while its output drives the light emitting diode of stage 14. Similarly the input to amplifier 24b is provided by detector 20 of stage 14 while the output of the amplifier 24b drives the light emitting diode 18 of stage 16. Inverting amplifiers are well known in the art and are commercially available. For a discussion of inverting amplifiers see Tobey et al, *Operational Amplifiers Design and Their Applications*, pg. 428 (1971). The amplifiers 24a and 24b are connected to a positive potential +V negative potential −V, and to ground. Each amplifier is designed so that when current flowing into its input is below a predetermined threshold level, the amplifier responds by supplying a sufficient forward biased voltage to turn on or activate its corresponding light emitting diode 18. On the other hand, when its input current equals or exceeds the threshold level, an amplifier turns off its output voltage.

Figure 3:
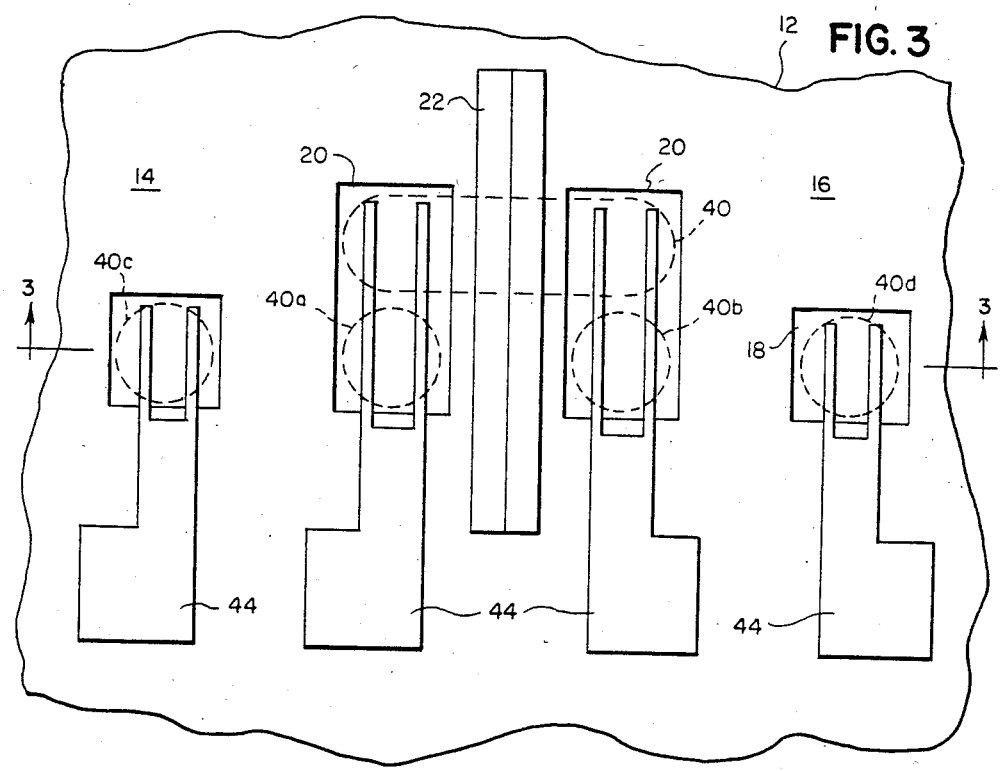
FIG. 3 is a more detailed plan view of the monolithic device.

All optical input signals are provided to the detectors 20. As shown in FIG. 3, the detectors 20 are much longer than the light emitting diodes 18 so they can receive a light input from either a set of reset fiber optic 40 (a or b) or t-type input from fiber optic 40. An optical input provided by fiber optic 40a to the detector 20 of stage 14 is thus the "set" function of the bistable circuit 10. Similarly, an optical pulse to the detector 20 of stage 16 provided by fiber optic 40b is the "reset" function of the bistable circuit 10. If an optical input signal is simultaneously applied to the detectors 20 of stages 14 and 16 by fiber optic 40, the circuit 10 acts as a T-type flip flop and changes state as will now be described. All the fiber optic elements 40a, 40b, and 40 are shown as dotted lines in FIG. 3 for clarity of illustration. They can be quite conventional and so will be well understood to those skilled in the art. As shown also by dotted lines in FIG. 3, separate fiber optic elements 40c and 40d are positioned above the LED's 18 of stages 14 and 16 respectively to provide the output connections for the device 12.

Figure 2:
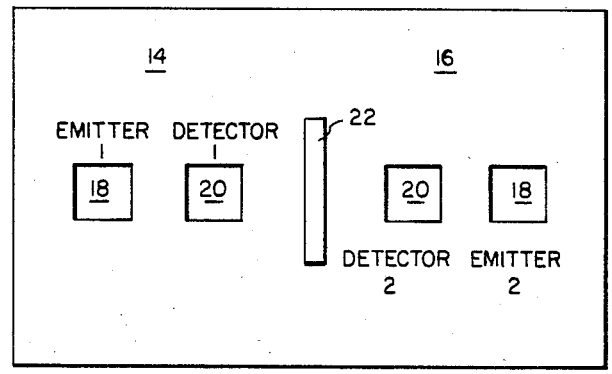
FIG. 2 is a schematic plan view showing the general organization of the light emitting diodes-detectors of the monolithic device shown in FIG. 1.
Figure 4:
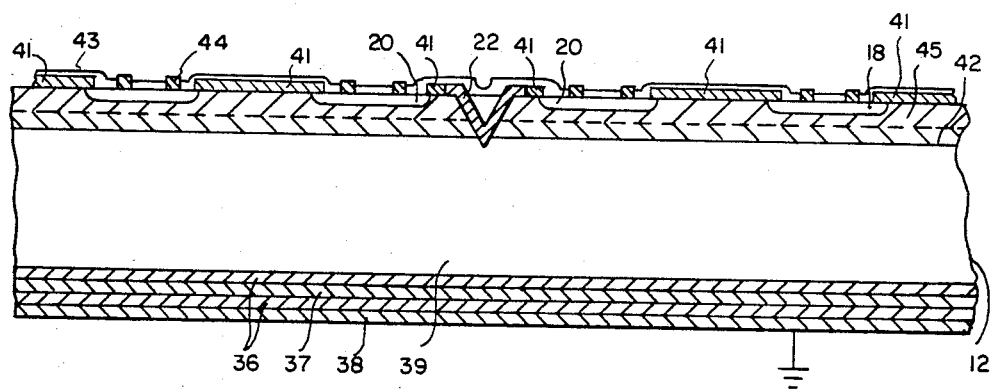
FIG. 4 is a sectional view taken along the lines 4—4 of the monolithic device shown in FIG. 3 showing a V-shaped groove used for optical isolation.

With reference to FIGS. 2, 3 and 4, let us consider now what happens when the light emitting diode 18 of stage 14 is activated by being forward biased. This diode produces subsurface light which passes through the device 12 and illuminates its corresponding detector 20. Some of this light is absorbed by detector 20 causing it to produce a photoinduced electrical current. This current provides a driving input into amplifier 24b. In response to this current, the amplifier 24b turns its output voltage off. Consequently, no forward bias voltage is applied to light emitting diode 18 of stage 16, and it is deactivated or inactive. The bistable circuit is now in one of its two stable states, the stage 14 being active and the stage 16 being inactive.

Now let us consider what happens if an optical pulse is delivered by fiber optic 40b to the detector 20 of inactive stage 16. In response to this pulse, the detector 20 produces a photoinduced current which is applied as an input to amplifier 24a, causing it to deactivate its output. The light emitting diode 18 of stage 14 is now no longer forward biased and stops producing light. The bistable circuit 10 has thereby changed state. In its new state, light emitting diode 18 of stage 16 produces light while the light emitting diode 18 of stage 14 does not.

Let us assume that stage 14 is active and its diode 18 produces light while stage 16 is inactive and its diode 18 does not produce light. Let us further assume that an optical pulse is delivered to both detectors simultaneously. Because it is illuminated by its corresponding LED 18, the detector 20 of active stage 14 is unaffected by this pulse. However, the optical input to the previously unilluminated detector 20 of inactive stage 16 causes it to produce a photocurrent which is applied as an input to inverting amplifier 24a. In response to this input, the amplifier 24a turns off its output forward bias voltage signal to the light emitting diode 18 of stage 14, which stops illuminating its corresponding detector 20. This detector ceases to produce a photocurrent. This in turn causes inverting amplifier 24b to turn on the LED 18 of stage 16. The circuit 10 has now changed state. The next simultaneous pulse to both detectors causes the circuit 10 to again change state. A simultaneous optical pulse to both detectors thereby proves the "T" or toggle function.

The set and reset and "T" input signals and the LED output signals are all shown to be transmitted by separate fiber optic elements. Those skilled in the art will appreciate that such signals could be transmitted to and from the device 12 by fiber optics or by wave guides which could be fabricated in the device 12.

The organization and techniques which can be used to form the device 12 will be discussed with reference to FIGS. 3 and 4.

Turning now to FIG. 4, layer 39 is a semiconductor crystal of n-type gallium arsenide of a thickness from about 250 $\mu$m to 400 $\mu$m. A layer 42 of n-type, graded-composition, gallium arsenide phosphide is grown epitaxially on the surface of the semiconductor crystal 39. The amount of phosphorus in the layer 42 is gradually increased as it is grown such that its composition varies from GaAs at the beginning of growth to GaAs$_{0.7}$P$_{0.3}$ at the end of growth. Layer 42 is from about 15 $\mu$m to 30 $\mu$m thick. A layer 45 of constant composition GaAs$_{0.7}$P$_{0.3}$ is then grown on the graded composition layer 42 to a thickness of from about 15 $\mu$m to 30 $\mu$m. Those skilled in the art will realize that the graded composition layer 42 reduces the effect of the strain induced on the devices fabricated in the constant composition layer 45 due to the lattice mismatch between the GaAs layer 39 and the GaAs$_{0.7}$P$_{0.3}$ layer 45.

A film 41 of silicon nitride is grown by plasma deposition on the epitaxial layer 45. Windows are etched, by a conventional photolithographic technique which employs a mask, in the film 41. The orientation of the mask used to define the windows in the film 41, with respect to the crystal 39, determines the orientation of the axis of the device 12 with respect to the crystalline planes of semiconductor 39. The silicon nitride film 41 serves as a mask for the diffusion of p-type impurities (for example, zinc) into layer 45.

A film of zinc oxide is grown on the silicon nitride film 41, and on the epitaxial layer 45 within the windows in the silicon nitride film, by chemical vapor deposition from dimethyl zinc and oxygen. A film of silicon dioxide is then grown on both sides of the device 12 by chemical vapor deposition from silane and oxygen to protect the device 12 from decomposition during the diffusion process. The device 12 is now placed in a furnace at an elevated temperature for a time interval sufficient for the zinc to diffuse into the n-type layer 45 to a depth of about 2 $\mu$m, forming the p-type regions of the light emitting diodes 18 and detectors 20. The zinc oxide film serves as a source of zinc; other methods can be used to diffuse zinc into layer 45, e.g. vapor-phase transport from a zinc arsenide source, zinc-doped spin-on emulsions, and ion implantation. The distance from each LED 18 to the detector 20 can be about 100 $\mu$m. As viewed in FIG. 3, each LED defines a square, with each side of the square being about 100 $\mu$m in length.

The silicon dioxide films and the zinc oxide film are now removed from the device 12. Metal electrodes 44 for contacting the p-type regions of the light emitting diodes and detectors are formed from evaporated aluminum using standard photolithographic and metal-lift-off techniques. The electrodes are then alloyed to layers 41 and 45 to improve the electrical contact between the electrodes 44 and the epitaxial layer 45 and to improve the mechanical adhesion of the electrodes 44 to the layers 41 and 45. Electrodes 44 are best shown in FIG. 3. A layer 36 formed of evaporated nickel, a layer 37 formed of evaporated gold germanium, and another layer 36 formed of evaporated nickel are deposited successively on the bottom side of the gallium arsenide crystal 39. The metal layers 36 and 37 are then alloyed to the semiconductor 39 to improve the electrical contact. A layer 38 formed of evaporated gold is deposited on layer 36. Layer 38 is electrically connected to ground (see also FIG. 1). Layers 36, 37 and 38 as will be appreciated by those skilled in the art, make good ohmic electrical ground contact to the n-type gallium arsenide crystal 39. A film of silicon nitride 43 is deposited on the silicon nitride layer 41, and on the epitaxial layer 45 within the windows in the silicon nitride film, to an appropriate thickness to form an antireflection coating.

Figure 5:
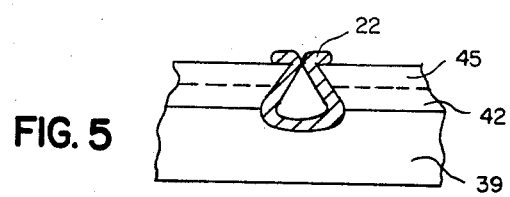
FIG. 5 is a partial sectional view similar to FIG. 4 but showing a reentrant groove used for optical isolation.

In order for the optical isolation 22 to be formed properly, the device 12 must be properly oriented as will be explained in discussion of the formation of the optical isolation 22. A rectangular opening is photolithographically made in the antireflection coating layer 43 and diffusion mask layer 41 between the detectors 20. An anisotropic etch (e.g. 5 percent by volume bromine in methanol) is used to form a groove in the device 12 sufficiently deep to penetrate the epitaxial layers 42 and 45 and enter the crystal substrate layer 39. For proper groove formation the device must be correctly oriented with respect to the crystalline axes of semiconductor 39. Assume the semiconductor wafer 39 has been cut from the crystal ingot such that the surface of the wafer is a (100) crystalline plane. As will be well understood to those skilled in the art, the three bracketed numbers are called the Miller indices of a plane and define the crystal's orientation. In this notation, [ ] are used for directions; ( ) are used for planes. If the rectangular opening formed in layers 41 and 43 has its longer dimension parallel to the [01$\bar{1}$] crystalline axis of semiconductor 39, the groove will be V-shaped, as shown in FIG. 4. A negative index is indicated by placing a minus sign (−) above an index number. If the rectangular opening has its longer dimension parallel to the [011] crystalline axis of the semiconductor 39, the groove will be reentrant, as shown in FIG. 5. Either type of groove can be used to form the optical isolation, but the device should be aligned as discussed above with either the [01$\bar{1}$] or the [011] crystalline axis or an irregularly shaped groove will result. A layer 22 of nickel is now electroplated in the groove to a thickness of from about 20 $\mu$m to 40 $\mu$m to complete the optical isolation.

Proper operation of the device requires that each detector 20 receive light only from the emitter 18 adjacent it and not from the other emitter. The epitaxial layer of GaAs$_{0.7}$P$_{0.3}$ is somewhat absorbent at the wavelength of its own emission; thus the detectors 20 absorb some of the light emitted by the emitters 18 and an optical signal can be transmitted from the emitters to the detectors. Because the epitaxial layer absorbs subsurface light from a light emitting diode, the emitter and detector cannot be placed so far apart that so much of the light will be absorbed and the detector cannot produce a signal which has a high enough amplitude to activate its amplifier. For a discussion of subsurface light emissions, see U.S. Pat. No. 4,284,884 to Dyment et al. Conversely, the detector and light emitting diode of the opposite stages must be well isolated from each other. One way to achieve isolation is to place the two emitter/detector stages far apart on the device; however this approach wastes expensive semiconductor material. The nickel barrier 22 optically isolates the two stages while allowing them to be fabricated in close proximity on the semiconductor wafer. Light which would be scattered beneath the nickel barrier from one emitter to the other detector is strongly absorbed in the GaAs layer 39 because the GaAs layer has a smaller bandgap than the GaAs$_{0.7}$P$_{0.3}$ emitter layer.

The invention has been described in detail with particular reference to a preferred embodiment thereof, but it will be understood that variations and modifications can be effected within the spirit and scope of the invention. For example, although only a single flip flop has been shown in the drawing, it will be understood that arrays of light emitting diodes and detectors could be fabricated in the device 12 in order to provide a plurality of logic gates. It will be apparent to those skilled in the art that the present invention is not limited to semiconductive layers formed from gallium arsenide but, rather, has general applicability with all semiconductor materials that can be used with light emitting diodes and detectors.

What is claimed is:

1. A bistable circuit for changing state and providing one of two optical outputs in response to an optical input, comprising:
   (a) a monolithic device having first and second optically isolated stages, each stage having a light emitting diode and a corresponding detector, the light emitting diode being responsive to an applied forward bias voltage to produce: (1) subsurface light which will pass through the device and illuminate its corresponding detector which becomes active, and (2) light which exits the surface of the device to provide an optical output;
   (b) signal inverting means for electrically coupling the detector of each stage to the light emitting diode of the other stage to activate such light emitting diode when its coupled detector is inactive and inactivate such light emitting diode when its coupled detector is active; and
   (c) input optical means for selectively illuminating an inactive detector causing it to change to an active state, whereby the bistable device changes state.

2. The monolithic device as set forth in claim 1, which includes:
   an extrinsic semiconductor layer having a top surface provided with a groove which separates the first and second stages;
   a layer of material formed in the groove selected to provide optical isolation between the stages; and
   the light emitting diode and detector of each stage being formed by diffusing extrinsic material through the surface into spaced regions of the semiconductor layer.

3. The monolithic device as set forth in claim 2, wherein the optically isolating material is electroplated nickel and the semiconductor layer is n-type gallium arsenide phosphide, the diffused regions being provided by diffused zinc.

* * * * *